United States Patent
Bucksch et al.

(10) Patent No.: US 6,754,869 B2
(45) Date of Patent: Jun. 22, 2004

(54) METHOD AND DEVICE FOR TESTING SET-UP TIME AND HOLD TIME OF SIGNALS OF A CIRCUIT WITH CLOCKED DATA TRANSFER

(75) Inventors: Thorsten Bucksch, München (DE); Ralf Schneider, München (DE)

(73) Assignee: Infineon Technologies AG, Munich (DE)

( * ) Notice: Subject to any disclaimer, the term of this patent is extended or adjusted under 35 U.S.C. 154(b) by 478 days.

(21) Appl. No.: 09/909,390

(22) Filed: Jul. 19, 2001

(65) Prior Publication Data

US 2002/0008503 A1 Jan. 24, 2002

(30) Foreign Application Priority Data

Jul. 19, 2000 (DE) .......................................... 100 35 169

(51) Int. Cl.[7] .......................... G06F 11/00; G01R 31/28
(52) U.S. Cl. ...................................... 714/744; 714/731
(58) Field of Search ............................... 714/744, 738, 714/731; 326/93; 327/141; 713/400–503

(56) References Cited

U.S. PATENT DOCUMENTS

| | | | |
|---|---|---|---|
| 3,611,377 A | * | 10/1971 | Rittenbach .................. 342/128 |
| 4,481,647 A | * | 11/1984 | Gombert et al. ............. 375/356 |
| 4,625,290 A | * | 11/1986 | White ......................... 345/419 |
| 4,849,702 A | * | 7/1989 | West et al. .................. 327/160 |
| 5,430,394 A | * | 7/1995 | McMinn et al. ............. 327/292 |
| 5,570,294 A | * | 10/1996 | McMinn et al. ............. 702/118 |
| 6,157,229 A | * | 12/2000 | Yoshikawa .................. 327/149 |
| 6,167,001 A | * | 12/2000 | Wu ............................. 368/113 |
| 6,426,985 B1 | * | 7/2002 | Iwata et al. ................. 375/371 |

FOREIGN PATENT DOCUMENTS

WO    WO 00/13186    3/2000    ........... G11C/29/00

\* cited by examiner

*Primary Examiner*—Albert Decady
*Assistant Examiner*—Esaw Abraham
(74) *Attorney, Agent, or Firm*—Laurence A. Greenberg; Werner H. Stemer; Gregory L. Mayback

(57) ABSTRACT

For testing, a reference clock signal is applied to a first delay path having a fixed delay and a second delay path having a variable delay. The delay paths are connected to inputs of a clocked circuit to initiate data transfer and they apply a clock signal and a data signal, respectively. The variable delay is set within the range $[t_F-n\Delta t/2; t_F+n\Delta t/2]$. The fixed delay $t_F$ is at least $n\Delta t/2$. For calibration, the setting range of the variable delay and the fixed delay are each increased to the k-fold value and the variable delay is incremented in steps from n=0 until three phase changes are detected. The value of n at the first phase cycle completion corresponds to the variable delay for the set-up time and the value of n at the third phase cycle completion corresponds to the variable delay for the hold time.

8 Claims, 2 Drawing Sheets

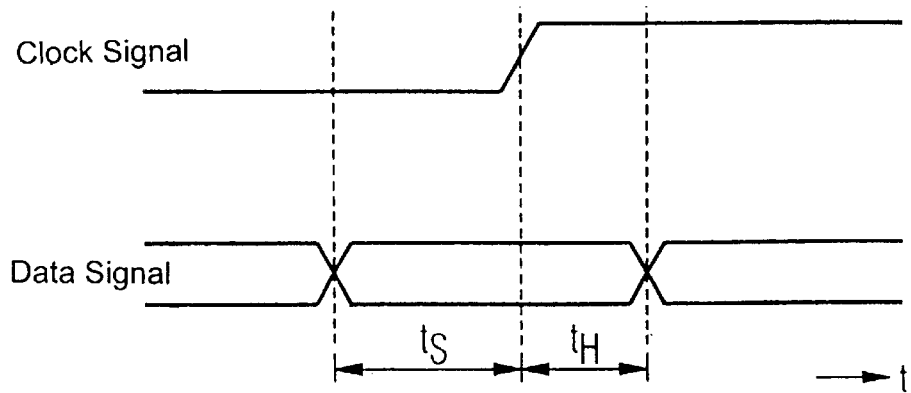
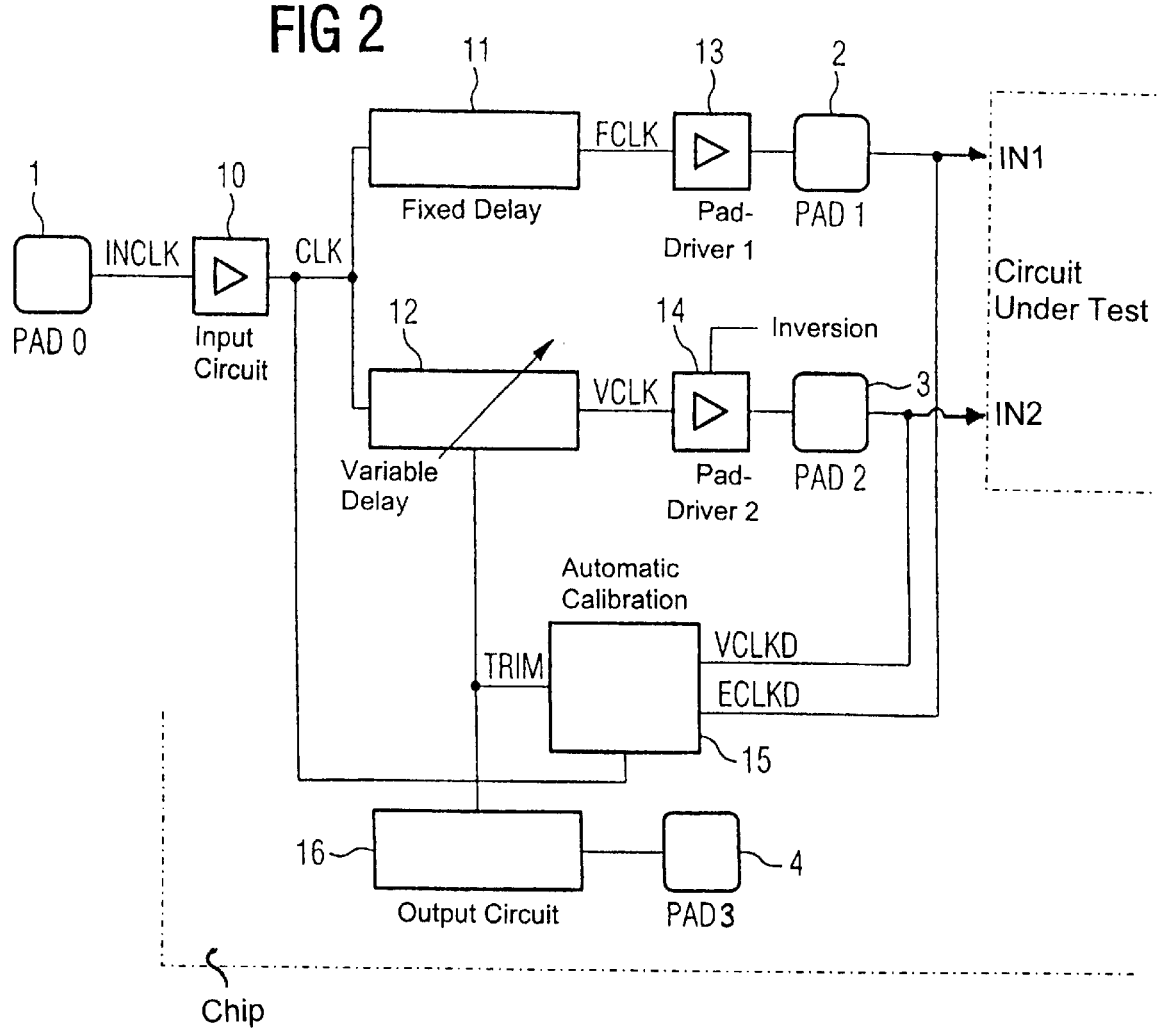

FIG 3
1st Phase Cycle
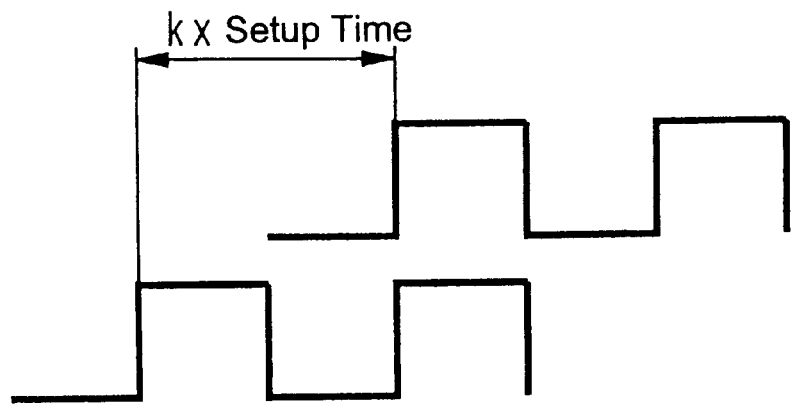
2nd Cycle
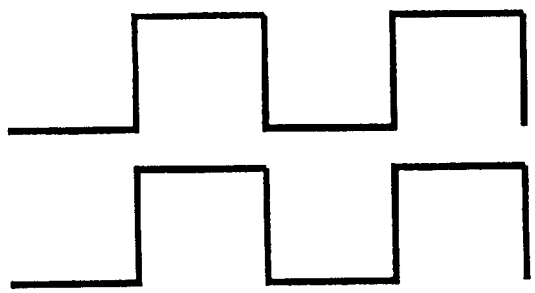
3rd Cycle
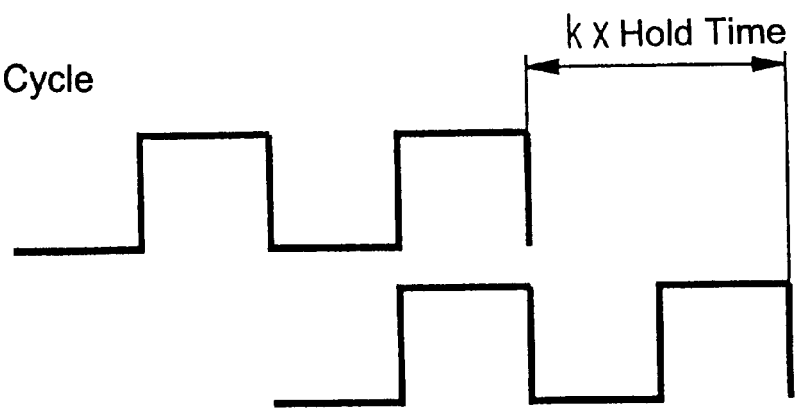

METHOD AND DEVICE FOR TESTING SET-UP TIME AND HOLD TIME OF SIGNALS OF A CIRCUIT WITH CLOCKED DATA TRANSFER

BACKGROUND OF THE INVENTION

Field of the Invention

The invention relates to a method and a device for testing set-up time and hold time of signals of a circuit with clocked data transfer.

In order to ensure completely satisfactory functioning in the course of data transfer, in particular in read/write memories, it is necessary to comply with specific temporal boundary conditions. In particular, it is important in the course of data transfer that a time frame is observed in which the signal to be assessed is constant, in order to be able to be correctly assessed and thus unambiguously identified. This time frame is composed of a set-up time and a hold time, the set-up time denoting that time window which begins at a relative instant before the rising or falling edge of a clock pulse and ends with a defined level of the relevant clock pulse edge. The hold time is to be understood as that time window which begins with a defined level of the rising or falling edge of a clock pulse and ends at a relative instant after the relevant edge.

The volumes of data which are intended to be transmitted in modern data transfer systems, for example in a read/write memory, are becoming greater and greater. The consequence of this is that the transmission cycles are becoming shorter and shorter. Thus, e.g. read/write memories are known which use clock pulses for data transfer at a frequency of 400 MHz, which enables a data transfer rate of 800 MHz since two data transfers are carried out in one clock period, namely both at the rising and at the falling edge of the clock pulse. In order to be able to correctly assess the transmitted signals at such a transmission frequency, a time frame of 400 ps is typically required, in which the transmitted signals must be constant in order to be able to be correctly assessed. In this case, this time frame is preferably divided into two symmetrical time windows around the edge of the clock signal, that is to say into a set-up time and a hold time of 200 ps in each case.

Before a circuit with clocked data transfer is incorporated into a data transfer system, that is to say e.g. a read/write memory into a computer, it is usually necessary to test the circuit and, in the process, to determine in particular the set-up time and the hold time. The very short set-up time and hold time e.g. in very fast read/write memories necessitate a high technical outlay for testing these time windows. In conventional practice, therefore, extremely expensive precision product testers with very high testing accuracy must be used.

International PCT publication WO 00/13186 discloses a system and a method for testing read/write memories in which a test module is integrated on the chip with a fast read/write memory in order to generate the time-critical signals for testing the set-up time and the hold time. In this case, an oscillator connected to the test module is used to apply a time signal to a clock generator of the test module, which generates the clock signals for the data transfer of the read/write memory. These clock signals are applied in parallel to the read/write memory to be tested and to a monitoring unit, a delay unit being provided which makes it possible to shift the clock signal relative to a fixedly predetermined write or read signal in order thus to define the time window in which data must remain constant in the course of data transfer in order to be correctly assessed. In this case, the delay unit is programmable in order to be able to set both the set-up time and the hold time.

One problem with the prior art test module, however, is the exact programming of the delay unit in order to preclude testing inaccuracies. Thus, an extremely fine gradation of the setting range of the variable delay time relative to the period of the clock pulse is necessary in order to be able to accurately determine the set-up time and the hold time. This requires a high degree of accuracy in the setting of the delay, and hence increased costs.

SUMMARY OF THE INVENTION

The object of the present invention is to provide a method and a device for testing the setup time and the hold time of signals in a circuit with clocked data transfer which overcomes the above-noted deficiencies and disadvantages of the prior art devices and methods of this general kind, and which is distinguished by a simple construction and high testing precision.

With the above and other objects in view there is provided, in accordance with the invention, a method of testing set-up time and hold time of signals of a circuit with clocked data transfer, which comprises the following method steps:

for testing, applying a reference clock signal with a given period to a first delay path having a fixed delay and to a second delay path having a variable delay, wherein the first delay path is connected to a first input of a clocked circuit for applying a clock signal, and the second delay path is connected to a second input of the clocked circuit for applying a data signal, the variable delay having a setting range $\Delta t_v$ with n equidistant steps and a basic delay $\Delta t$ in a range from $(t_F - n\Delta t/2)$ to $(t_F + n\Delta t/2)$, where $t_F$ is a fixed delay and $t_F$ is at least $n\Delta t/2$; and for calibrating, increasing the given period of the reference clock signal, and the setting range $\Delta t_v$ of the variable delay and the fixed delay $t_F$ each to a k-fold value and incrementing the variable delay in steps from n=0 until three phase cycle completions are detected, wherein a value of n at an instant of the first phase cycle completion corresponds to the variable delay for the set-up time and the value n at an instant of the third phase cycle completion corresponds to the variable delay for the hold time.

In other words, for testing purposes, a reference clock signal is applied to a first delay path having a fixed delay and a second delay path having a variable delay, which are each connected to an input of the clocked circuit in order to initiate data transfer of the clocked circuit, the first delay path applying a clock signal and the second delay path a data signal to the clocked circuit, the variable delay having a setting range $\Delta t_v$ with n equidistant steps and a basic delay $\Delta t$ in the range of $[t_F - n\Delta t/2; t_F + n\Delta t/2]$ and the fixed delay $t_F$ being at least $n\Delta t/2$. For calibration, the period of the reference clock signal, the setting range of the variable delay and the fixed delay are in each case increased to the k-fold value and the variable delay is incremented in a stepwise manner from n=0 until three phase changes are detected, the value of n at the instant of the first phase cycle completion corresponding to the variable delay for the set-up time and the value of n at the instant of the third phase cycle completion corresponding to the variable delay for the hold time.

This calibration technique enables the set-up time and the hold time to be defined very simply and accurately even in the case of extremely short time windows, since increased precision in the course of setting is achieved by virtue of the multiplication of the delay in the form of a delay magnification during the calibration.

In accordance with an added feature of the invention, a further calibration measurement is carried out and the variable delay is thereby incremented in steps from n=0 until a phase cycle completion occurs, where a difference between the value in the case of this phase cycle completion and the value in the case of the second phase cycle completion of the first calibration measurement corresponds to the propagation time difference between the signals on the fixed delay path and the variable delay path.

With the above and other objects in view there is also provided, in accordance with the invention, a device for testing set-up time and hold time of signals of a circuit with clocked data transfer, comprising:

a first terminal for applying a reference signal with a given period, a second output connected to a first input of a clocked circuit, and a third output connected to a second input of the clocked circuit;

a first delay path connected to the second output, the first delay path having a fixed delay $t_F$;

a second delay path connected to the third output, the second delay path having a variable delay with a setting range $\Delta t_v$ with n equidistant steps and a basic delay $\Delta t$ in a range from $(t_F-n\Delta t/2)$ to $(t_F+n\Delta t/2)$, and wherein the fixed delay $t_F$ of the first delay path is at least $n\Delta t/2$;

a calibration unit connected for calibrating the first delay path and the second delay path, and wherein, for calibration, the period of the reference clock signal, the setting range $\Delta t_v$ of the variable delay, and the fixed delay $t_F$ are each increased to a k-fold value and the variable delay is incremented in steps from n=0 until three phase cycle completions are detected, and wherein a value of n at an instant of a first phase cycle completion corresponds to the variable delay for the set-up time and the value of n from the instant of the third phase cycle completion corresponds to the variable delay for the hold time.

In accordance with an additional feature of the invention, the calibration unit is configured for carrying out a further calibration measurement in the course of which the variable delay is incremented in steps from n=0 until a phase cycle completion occurs and a difference between the value of n upon the phase cycle completion and the value of n in the case of a second phase cycle completion of a first calibration measurement is determined as propagation time difference between the fixed delay path and the variable delay path.

In accordance with another feature of the invention, the circuit is commonly integrated with the circuit (or circuits) to be tested on a common chip.

In accordance with a further feature of the invention, an input circuit is connected to the first terminal, the input circuit buffering an applied periodic reference signal for generating therefrom a test signal.

In accordance with again a further feature of the invention, each of the first delay path and the second delay path include a respective amplifier unit.

In accordance with a concomitant feature of the invention, an inverting device is connected to one of the first delay path and the second delay path for inverting a respective output signal.

In accordance with a preferred embodiment of the invention, the calibration can furthermore be effected by the test circuit itself, thereby significantly reducing the calibration outlay.

In accordance with a further preferred embodiment, in a second calibration cycle, the variable delay is incremented in a stepwise manner from n=0, the variable delay and the fixed delay not being increased to the k-fold value, with the result that only one phase cycle completion occurs. The difference between the value of n or the associated variable delay in the case of this phase cycle completion and the value of n or the associated variable delay in the case of the second phase cycle completion of the first calibration cycle corresponds to the propagation time difference between the two signal paths, i.e. the fixed delay path and the variable delay path. By taking account of this propagation time difference between the two signal paths, it is possible to achieve an increased precision in the course of setting the set-up time and the hold time.

Other features which are considered as characteristic for the invention are set forth in the appended claims.

Although the invention is illustrated and described herein as embodied in a method and device for testing set-up time and hold time of signals of a circuit with clocked data transfer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a timing diagram showing a clocked data transfer operation;

FIG. 2 is a block diagram of a test circuit according to an embodiment of the invention for determining set-up time and hold time of signals of a circuit with clocked data transfer; and FIG. 3 are three phase cycle diagrams of a calibration operation according to the invention with delay magnification.

DESCRIPTION OF THE PREFERRED EMBODIMENTS

Referring now to the figures of the drawing in detail and first, particularly, to FIG. 1 thereof, there is illustrated a data transfer. It is noted that, in order to ensure completely satisfactory functioning e.g. in the case of a read/write memory, it is necessary to comply with temporal boundary conditions in the course of the data transfer. FIG. 1 shows such a data transfer operation with a clock pulse and a data signal to be assessed. In order to be able to correctly perform the data transfer, the data signal must be valid, i.e. stable, for a minimum time. This time frame is composed of two fixedly defined time windows, the set-up time $t_S$ and the hold time $t_H$, the set-up time $t_S$ specifying the instant from which the data signal must be constant before the rising or falling edge of the clock pulse, and the hold time $t_H$ specifying the instant after the rise or the fall of the edge of the clock pulse until which the data signal must remain stable. In the case of fast read/write memories having a clock frequency of 400 MHz, in the case of which the data transfer can be carried out at a frequency of 800 MHz, a data transfer takes place both in the event of the rising edge and in the event of the falling edge of the clock pulse, with the result that the setup time and the hold time are typically in the region of 200 ps in each case.

FIG. 2 shows one possible embodiment of a test circuit for a clocked circuit, e.g. a read/write memory. In this case, the test circuit is preferably integrated on the chip with the circuit or circuits to be tested, and has four terminals 1, 2, 3 and 4, terminal 1 being connected to an external signal generator (not shown), terminals 2 and 3 being connected (indicated by arrows) to the circuit (not shown) to be tested, and terminal 4 being connected to an output unit (not shown). By means of the signal generator connected to terminal 1, a periodic reference clock signal INCLK is applied to an input circuit 10, which internally buffers the reference clock signal and generators the test clock signal CLK for the test circuit. This clock signal CLK is applied by the input circuit 10 in parallel to a fixed delay element 11 and a variable delay element 12. The fixed delay element 11 has a fixed basic delay $t_F$, whereas the variable delay element 12 has a setting range $\Delta t_v$ for the delay. This setting range $\Delta t_v$ is subdivided into n equidistant sections with a basic delay $\Delta t$, the setting range extending from $[t_F-n\Delta t/2; t_F+n\Delta t/2]$. The fixed delay $t_F$ of the delay element 11 is preferably $n\Delta t/2$, but may also be a multiple thereof. This circuit design makes it possible for the delayed clock signal VCLK output by the variable delay element 12 to be shifted positively or negatively in the temporal profile relative to the delayed clock signal FCLK output by the fixed delay element 11.

The delayed clock signal FCLK output by the fixed delay element 11 is applied via an amplifier unit 13, which amplifies the signal, to the output 2, which is connected to a first input of a circuit to be tested. The delayed clock signal VCLK output by the variable delay element 12 is applied via an amplifier unit 14 to the output 3, which is connected to a second input of the circuit to be tested. The two signals VCLK and FCLK then initiate a data transfer in the circuit to be tested, the signal FCLK output by the fixed delay element 11 corresponding to a clock pulse, whereas the signal VCLK output by the variable delay element 12 corresponds to a data transfer signal. In this case, the set-up time $t_S$ or the hold time $t_H$ in the course of the data transfer of the circuit to be tested is set by means of the temporal delay of the signal VCLK relative to the signal FCLK. The set-up time $t_S$ is tested when the signal VCLK is applied to the clocked circuit at a relative instant before the signal FCLK, whereas the hold time $t_H$ is tested when the signal VCLK is output to the clocked circuit at a relative instant after the signal FCLK.

The data transfer initiated in the clocked circuit is assessed, with the object to ascertain whether or not a valid data transfer was performed, i.e. whether there is a violation of the set-up time $t_S$ or of the hold time $t_H$. In the course of the data transfer, the signal FCLK of the fixed delay element 11 serves as clock signal and the signal VCLK of the variable delay element 12 serves as data signal for the clocked circuit. The delay between these two signals, said delay being set in the test circuit, defines the set-up time or hold time to be tested in the clocked circuit. The assessment of the validity of the data transfer can in this case be performed in the clocked circuit itself. As an alternative, however, it is also possible for this assessment to be performed in a separate evaluation unit which is part of the test circuit.

In order to be able to test the set-up time $t_S$ or hold time $t_H$ both in the case of in-phase signals and in the case of in-antiphase signals, i.e. in the case of a rising and a falling pulse edge, before the delayed signals are applied to the clocked circuit, one of the signals can be inverted. In the embodiment shown in FIG. 2, this inversion is performed with the signal VCLK of the variable delay element 12 preferably in the amplifier unit 14.

The circuit to be tested, i.e., the device under test DUT, is schematically indicated with dashed lines at the right-hand side of FIG. 2. The circuit to be tested has a first input IN1 connected to a second output 2 of the test device according to the invention and a second input IN2 connected to a third output 3 of the test device.

As noted above, the circuit to be tested (or several such circuits) may be integrated on one and the same common chip together with the test device according to the invention. This is schematically indicated with the chip outline CHIP in FIG. 2.

For precise setting of the set-up time $t_S$ or of the hold time $t_H$ by the signal VCLK delayed relative to the signal FCLK, it is necessary to perform exact calibration. This is necessary, in particular, also because the basic delay $\Delta t$ and the propagation times on the respective signal paths of the fixed delay element 11 and of the variable delay element 12 are dependent on the production parameters of the test circuit, which, however, cannot be defined sufficiently exactly. The calibration, i.e. the definition of the desired set-up time $t_S$ or of the hold time $t_H$ of the test circuit is preferably carried out by the test circuit itself, the evaluation unit 15 serving as calibration unit.

In order to calibrate the test circuit, two calibration measurements are carried out, the cycle of the first calibration measurement being shown in FIG. 3. For the first calibration measurement, as in the test operation, the reference clock signal INCLK is applied via the terminal 1, which signal is buffered via the input circuit 10 and converted into the clock signal CLK having a precisely defined period. For the calibration, however, the period of the clock signal CLK is increased by k-fold relative to the test operation, i.e. the period of the clock signal CLK is adjusted to k times the delay value to be set for the purpose of testing the set-up time or hold time. At the same time, the delay $t_F$ in the fixed delay element 11 is also increased to the k-fold value, resulting in a value of $kn\Delta t/2$ for the fixed delay $t_F$. Furthermore, the modulation range $\Delta t_v$ of the variable delay element 12 is also increased to the k-fold value, as a result of which the modulation range $\Delta t_v$ is defined on the range of $[0; kn\Delta t]$.

For calibration, the variable delay element is then incremented from n=0 until the evaluation circuit 15, which assesses the phase of the signal FCLK with respect to the signal VCLK, has detected three phase cycle completions. These three phase changes are shown in FIG. 3. The first phase change ascertained by the evaluation unit 15 corresponds to k times the set-up time $t_S$, the second phase change specifies the phase identity between the signal FCLK and the signal VCLK, and the third phase change arises in the case of k times the hold time $t_H$. The values of n for which these phase cycle completions occur are stored by the evaluation circuit 15 and are designated hereinafter as n1, n2 and n3. The value n1 thus defines the setting of the set-up time $t_S$ and the value n3 the setting of the hold time $t_H$ in the test circuit. By virtue of the calibration of the set-up time and of the hold time at k times the delay values to be set, i.e. the inventive use of a kind of delay magnification, it is possible to achieve an increased precision in the setting of these values.

In order, if appropriate, also to take account of the different propagation times on the signal paths of the fixed delay element 11 and of the variable delay element 12, a second calibration measurement is carried out without magnification function, that is to say at a value of k=1. For this purpose, the modulation range of the variable delay element 12 is once again incremented from n=0, with only one phase cycle completion taking place. The value of n for this phase change, hereinafter designated as n0, corresponds, like the value n2 in the case of the first calibration measurement, to the phase identity between the signal VCLK and the signal FCLK. The difference between the value n2 and the value n0 thus represents the propagation time difference between the two signal paths of the fixed delay element 11 and of the variable delay element 12. For correct setting of the set-up time and of the hold time, the values n1 and n2 must therefore be corrected by the difference $\Delta n = n0 - n2$. A set-up time $t_S$ as a value $n_a = n_1 + \Delta n$ and a hold time $t_H$ as a value $n_H = n_3 + \Delta n$ are then produced.

In order to carry out calibration of the set-up time and of the hold time for in-antiphase signal generation, too, the two calibration measurements explained above must be repeated, one of the delayed signals having to be inverted. This inversion must then be taken into account in the evaluation circuit 15.

In the course of the calibration measurements, the accuracy of the input circuit of the evaluation unit 15 can, moreover, be additionally increased since the specification of the module to be tested, e.g. its current limiting, does not have to be complied with in the calibration mode.

The resulting total error when testing with the test circuit presented is $F = F_{TEXt}/k + F_{\Delta tV}/2 + F_{Cal}$, where $F_{TEXt}$ corresponds to the error of the externally supplied frequency, $F_{\Delta tV}$ corresponds to the resolution limit, determined by the basic delay $\Delta t$ (in n steps), and $F_{Cal}$ corresponds to the error influence of the calibration.

This total error can be kept very small in particular by virtue of the calibration according to the invention, thereby achieving a high precision when testing the set-up time and the hold time.

The features of the invention which are disclosed in the above description, the drawings and the claims may be of importance both individually and in any desired combination for the realization of the invention in its various configurations.

We claim:

1. A method of testing set-up time and hold time of signals of a circuit with clocked data transfer, which comprises the following method steps:

for testing, applying a reference clock signal with a given period to a first delay path having a fixed delay and to a second delay path having a variable delay, wherein the first delay path is connected to a first input of a clocked circuit for applying a clock signal, and the second delay path is connected to a second input of the clocked circuit for applying a data signal, the variable delay having a setting range $\Delta t_v$ with n equidistant steps and a basic delay $\Delta t$ in a range from $(t_F - n\Delta t/2)$ to $(t_F + n\Delta t/2)$, where $t_F$ is a fixed delay and $t_F$ is at least $n\Delta t/2$; and for calibrating, increasing the given period of the reference clock signal, and the setting range $\Delta t_v$ of the variable delay and the fixed delay $t_F$ each to a k-fold value and incrementing the variable delay in steps from n=0 until three phase cycle completions are detected, wherein a value of n at an instant of the first phase cycle completion corresponds to the variable delay for the set-up time and the value n at an instant of the third phase cycle completion corresponds to the variable delay for the hold time.

2. The method according to claim 1, which comprises carrying out a further calibration measurement and thereby incrementing the variable delay in steps from n=0 until a phase cycle completion occurs, where a difference between the value in the case of this phase cycle completion and the value in the case of the second phase cycle completion of the first calibration measurement corresponds to the propagation time difference between the signals on the fixed delay path and the variable delay path.

3. A device for testing set-up time and hold time of signals of a circuit with clocked data transfer, comprising:

a first terminal for applying a reference signal with a given period, a second output connected to a first input of a clocked circuit, and a third output connected to a second input of the clocked circuit;

a first delay path connected between said first terminal carrying the reference signal and said second output, said first delay path having a fixed delay $t_F$;

a second delay path connected between said first terminal carrying the reference signal and said third output, said second delay path having a variable delay with a setting range $\Delta t_v$ with n equidistant steps and a basic delay $\Delta t$ in a range from $(t_F - n\Delta t/2)$ to $(t_F + n\Delta t/2)$, and wherein the fixed delay $t_F$ of said first delay path is at least $n\Delta t/2$;

a calibration unit connected for calibrating said first delay path and said second delay path, and wherein, for calibration, the period of the reference clock signal, the setting range $\Delta t_v$ of the variable delay, and the fixed delay $t_F$, are each increased to a k-fold value and the variable delay is incremented in steps from n=0 until three phase cycle completions are detected, and wherein a value of n at an instant of a first phase cycle completion corresponds to the variable delay for the set-up time and the value of n from the instant of the third phase cycle completion corresponds to the variable delay for the hold time.

4. The device according to claim 3, wherein said calibration unit is configured for carrying out a further calibration measurement in the course of which the variable delay is incremented in steps from n=0 until a phase cycle completion occurs and a difference between the value of n upon the phase cycle completion and the value of n in the case of a second phase cycle completion of a first calibration measurement is determined as propagation time difference between said fixed delay path and said variable delay path.

5. The device according to claim 3 commonly integrated with the circuit to be tested on a common chip.

6. The device according to claim 3, which comprises an input circuit connected to said first terminal, said input circuit buffering an applied periodic reference signal for generating therefrom a test signal.

7. The device according to claim 3, wherein each of said first delay path and said second delay path include a respective amplifier unit.

8. The device according to claim 3, which further comprises an inverting device connected to one of said first delay path and said second delay path for inverting a respective output signal.

* * * * *